(12) United States Patent
Oh et al.

(10) Patent No.: US 10,969,688 B2
(45) Date of Patent: Apr. 6, 2021

(54) SUBSTRATE TREATING APPARATUS AND SUBSTRATE TREATING METHOD

(71) Applicant: SEMES CO., LTD., Chungcheongnam-do (KR)

(72) Inventors: Doo Young Oh, Chungcheongnam-do (KR); Joon Jae Lee, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 132 days.

(21) Appl. No.: 16/033,480

(22) Filed: Jul. 12, 2018

(65) Prior Publication Data

US 2019/0025700 A1 Jan. 24, 2019

(30) Foreign Application Priority Data

Jul. 21, 2017 (KR) .......................... 10-2017-0092340

(51) Int. Cl.
*G03F 7/20* (2006.01)
*G03F 7/00* (2006.01)
(Continued)

(52) U.S. Cl.
CPC .............. *G03F 7/2041* (2013.01); *B05C 9/12* (2013.01); *B05C 11/1044* (2013.01);
(Continued)

(58) Field of Classification Search
CPC ....... B05C 5/027; B05C 9/12; B05C 11/1044; B05C 11/11; B05B 15/50; B05B 15/55;
(Continued)

(56) References Cited

U.S. PATENT DOCUMENTS

| | | | | |
|---|---|---|---|---|
| 2007/0266936 | A1* | 11/2007 | Shiobara | ........... H01L 21/67253 118/53 |
| 2008/0100809 | A1* | 5/2008 | Nakashima | ....... H01L 21/67253 355/27 |
| 2012/0164572 | A1* | 6/2012 | Miyata | ................ H01L 21/6715 430/270.1 |

FOREIGN PATENT DOCUMENTS

| | | |
|---|---|---|
| JP | 3294023 B2 | 4/2002 |
| JP | 6000782 B2 | 9/2016 |

(Continued)

*Primary Examiner* — Laura Edwards
(74) *Attorney, Agent, or Firm* — Li & Cai Intellectual Property (USA) Office

(57) ABSTRACT

Disclosed are a substrate treating apparatus and a substrate treating method. According to an embodiment of the inventive concept, the purge operation of the purge nozzle is performed while the nozzle arm is moved from the first substrate support member to the second substrate support member, it hardly influences the operation of treating the substrate while the nozzle arm is moved from the first substrate support member to the second substrate support member. According to an embodiment of the inventive concept, the substrate treating apparatus may perform an operation of purging the photosensitive liquid nozzle while the treatment liquid supply unit performs a process of supplying the photosensitive liquid to the substrate. Accordingly, because the operation of purging the photosensitive liquid nozzle is performed at the same time when the substrate treating apparatus performs a process, productivity may be improved.

8 Claims, 11 Drawing Sheets

(51) Int. Cl.
   *G03F 7/004* (2006.01)
   *H01L 21/67* (2006.01)
   *H01L 21/677* (2006.01)
   *G03F 7/16* (2006.01)
   *B05C 11/10* (2006.01)
   *B05C 9/12* (2006.01)

(52) U.S. Cl.
   CPC .......... *G03F 7/0035* (2013.01); *G03F 7/0048* (2013.01); *G03F 7/162* (2013.01); *H01L 21/6715* (2013.01); *H01L 21/67051* (2013.01); *H01L 21/67109* (2013.01); *H01L 21/67178* (2013.01); *H01L 21/67745* (2013.01)

(58) Field of Classification Search
   CPC ...... G03F 7/2041; G03F 7/162; G03F 7/0035; G03F 7/0048; H01L 21/67178; H01L 21/67051; H01L 21/6715; H01L 21/67253; B08B 3/02
   USPC .......................................... 118/663, 302, 313
   See application file for complete search history.

(56) References Cited

FOREIGN PATENT DOCUMENTS

| | | |
|---|---|---|
| KR | 10-2003-0059046 A | 7/2003 |
| KR | 10-0629918 B | 9/2006 |
| KR | 10-1435225 B | 8/2014 |
| KR | 10-2015-0068908 A | 6/2015 |
| KR | 10-2016-0007392 A | 1/2016 |
| KR | 10-1670095 B | 10/2016 |

\* cited by examiner

SUBSTRATE TREATING APPARATUS AND SUBSTRATE TREATING METHOD

CROSS-REFERENCE TO RELATED APPLICATIONS

This application claims priority under 35 U.S.C. § 119 to Korean Patent Application No. 10-2017-0092340 filed on Jul. 21, 2017, in the Korean Intellectual Property Office, the disclosures of which are incorporated by reference herein in their entireties.

BACKGROUND

Embodiments of the inventive concept described herein relate to a substrate treating apparatus and a substrate treating method.

Various processes such as cleaning, deposition, photolithography, etching, and ion implantation are performed to manufacture a semiconductor device. A photolithographic process performed to form a pattern plays an important role in achieving high integration of a semiconductor device.

The photolithographic process is performed by coating a photosensitive liquid on a substrate. In the process of coating the photosensitive liquid, the photosensitive liquid of a preset amount may be coated while the substrate is rotated. A purge operation may be performed to adjust states of a nozzle for coating the photosensitive liquid and a pipeline connected to the nozzle. The purge operation is performed by discharging the photosensitive liquid of a preset amount.

SUMMARY

Embodiments of the inventive concept provide a substrate treating apparatus that may efficiently treat a substrate, and a substrate treating method.

Embodiments of the inventive concept also provide a substrate treating apparatus that may perform a purge operation while a substrate is treated, and a substrate treating method.

In accordance with an aspect of the inventive concept, there is provided a substrate treating apparatus including a first substrate support member and a second substrate support member configured to support a substrate, a plurality of nozzles configured to discharge a treatment liquid to the substrate located in the first substrate support member and the second substrate support member, a nozzle arm configured to support the nozzles, a purge port disposed between the first substrate support member and the second substrate support member, a driving member configured to move the nozzle arm between any two of the first substrate support member, the purge port, and the second substrate support member, and a controller configured to control the nozzle arm and the driving member, wherein the controller controls the nozzle arm and the driving member such that a purge nozzle that is one of the plurality of nozzles performs a purge operation by discharging the treatment liquid to the purge port in a process of moving the nozzle arm to one of the first substrate support member and the second substrate support member after the nozzle arm discharges the treatment liquid from the other of the first substrate support member and the second substrate support member.

The controller may allow the purge nozzle to perform a purge operation a preset number of times in the process of moving the nozzle arm between the first substrate support member and the second substrate support member.

The purge operations of the preset number of times may be continuously performed in the process of moving the nozzle arm between the first substrate support member and the second substrate support member.

The purge operations of the preset number of times may be intermittently performed in the process of moving the nozzle arm between the first substrate support member and the second substrate support member.

The purge port may include a cleaner configured to clean the nozzle, and the controller may control the cleaner such that the cleaner cleans the purge nozzle after the purge operations are performed the preset number of times.

The controller may generate an alarm if it is determined that the purge nozzle is to be used in the first substrate support member or the second substrate support member after the purge operation of the purge nozzle is started.

The substrate treating apparatus may further include a holder in which a cassette in which the substrate is received is located, and the controller may stop carrying-out of the substrate from the cassette if it is determined that the purge nozzle is to be used in the first substrate support member or the second substrate support member after the purge operation of the purge nozzle is started.

The controller may stop carrying-in of the substrate to one of the first substrate support member and the second substrate support member, in which the purge nozzle is scheduled to be used, if it is determined that the purge nozzle is to be used in the first substrate support member or the second substrate support member after the purge operation of the purge nozzle is started.

The plurality of nozzles may discharge a photosensitive liquid.

In accordance with another aspect of the inventive concept, there is provided a substrate treating method wherein a nozzle arm having a plurality of nozzles treats a substrate by discharging a treatment liquid while moving between a first substrate support member and a second substrate support member that support the substrate, and wherein a purge nozzle that is one of the plurality of nozzles performs a purge operation by discharging the treatment liquid to a purge port located between the first substrate support member and the second substrate support member in a process of moving the nozzle arm to one of the first substrate support member and the second substrate support member after the nozzle arm discharges the treatment liquid from the other of the first substrate support member and the second substrate support member.

The purge operation of the purge nozzle may be performed a preset number of times in a process of moving the nozzle arm between the first substrate support member and the second substrate support member.

The purge port may clean the purge nozzle after the purge nozzle performs the purge operation the preset number of times.

An interlock operation may be performed if it is determined that the purge nozzle discharges the treatment liquid to the first substrate support member or the second substrate support member before the purge operation is performed the preset number of times after the purge operation of the purge nozzle is initiated.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Hereinafter, exemplary embodiments of the inventive concept will be described in more detail with reference to the accompanying drawings. The embodiments of the inventive concept may be modified in various forms, and the scope of the inventive concept should not be construed to be limited to the following embodiments. The embodiments of the inventive concept are provided to describe the inventive concept for those skilled in the art more completely. Accordingly, the shapes of the components of the drawings are exaggerated to emphasize clearer description thereof.

The system of the present embodiment is used to perform a photolithographic process on a substrate, such as a semiconductor wafer or a flat display panel. In particular, the system of the present embodiment is used to perform a coating process, a development process, and a pre/post-exposure process that is required before and after liquid-immersion and exposure on a substrate. Hereinafter, a case of using a substrate as a substrate may be described as an example.

Figure 1:
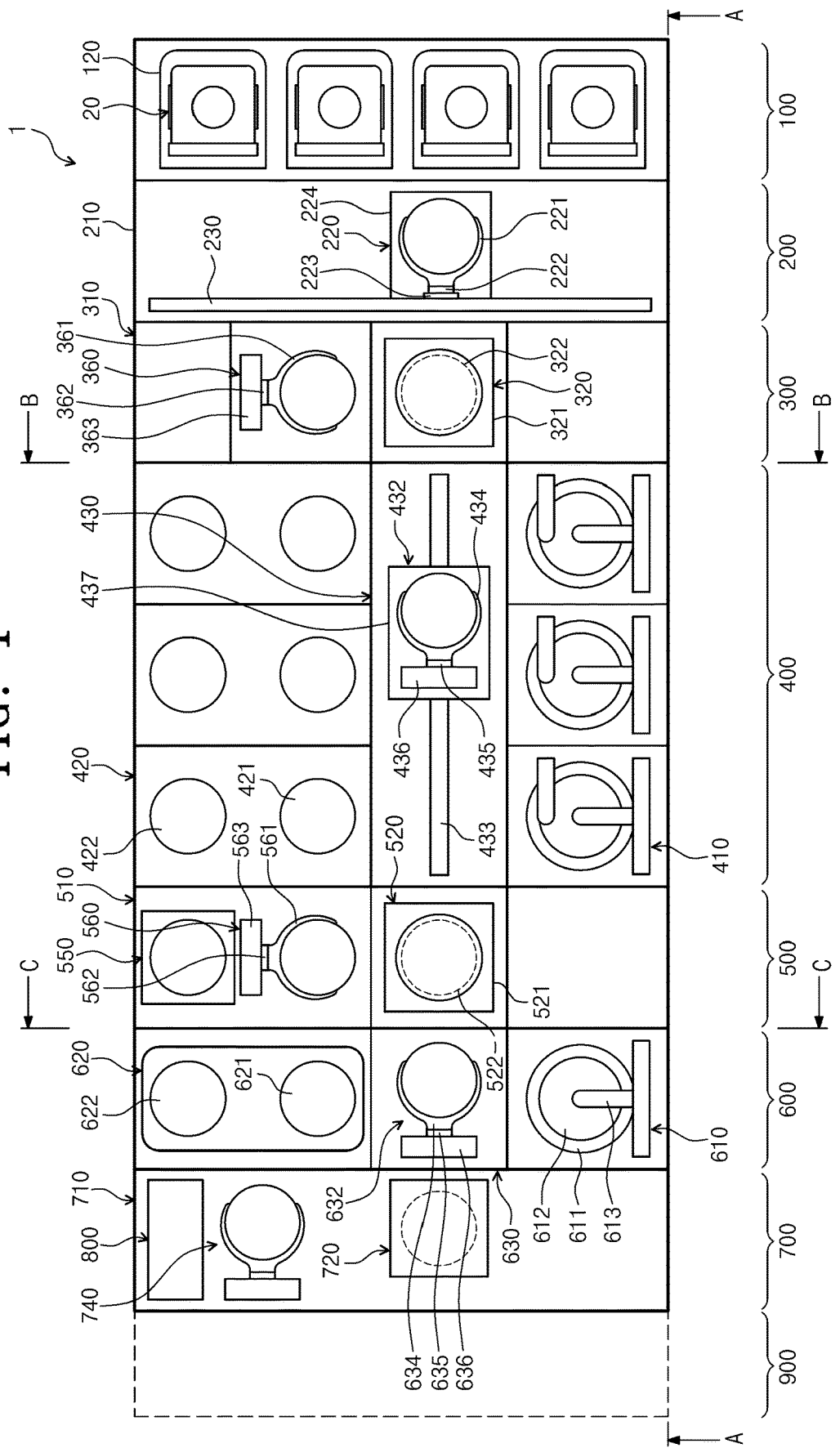
FIG. 1 is a view of a substrate treating apparatus, viewed from the top.
Figure 2:
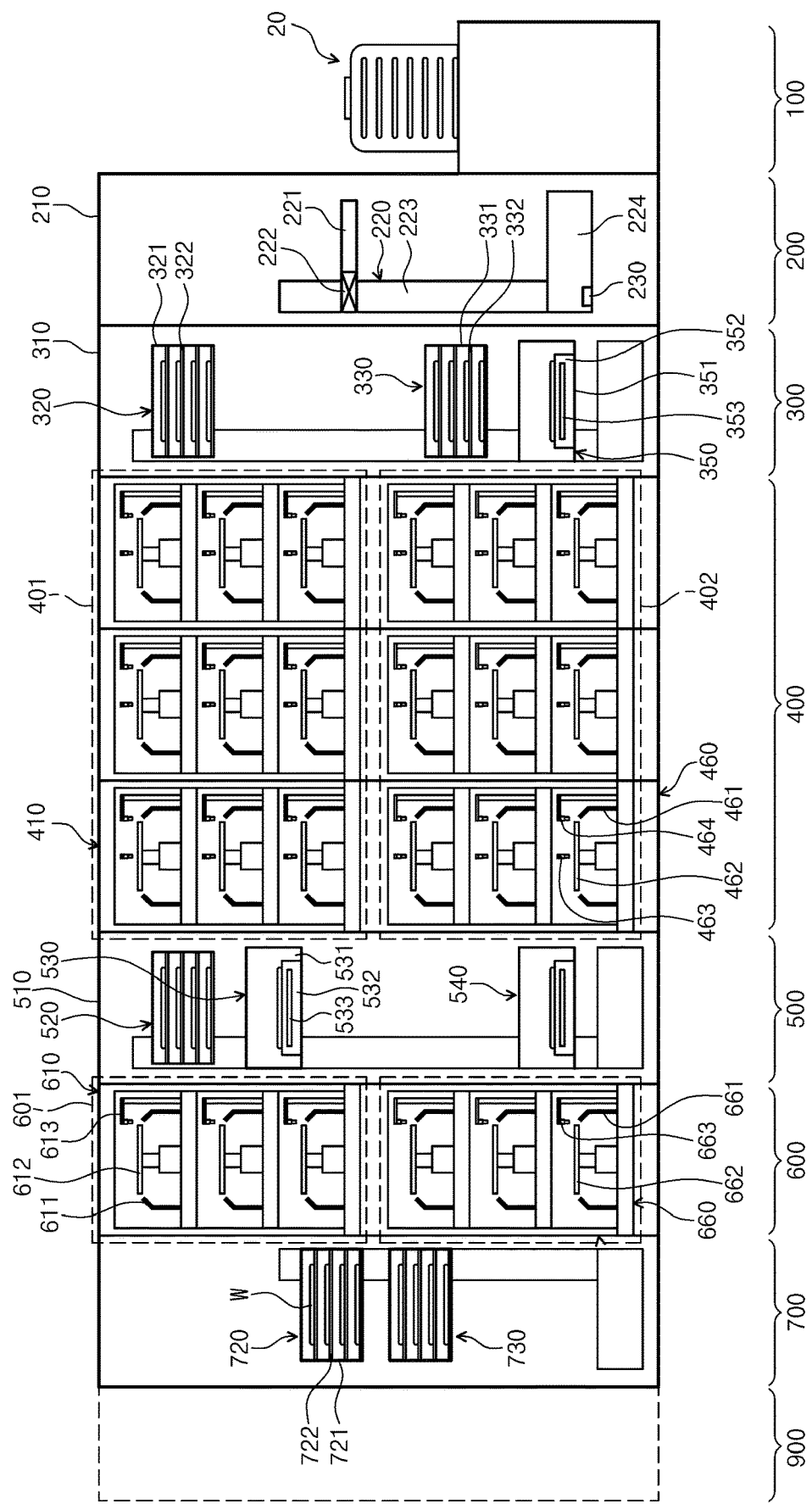
FIG. 2 is a sectional view of the system of FIG. 1, taken along line A-A of FIG. 1.
Figure 3:
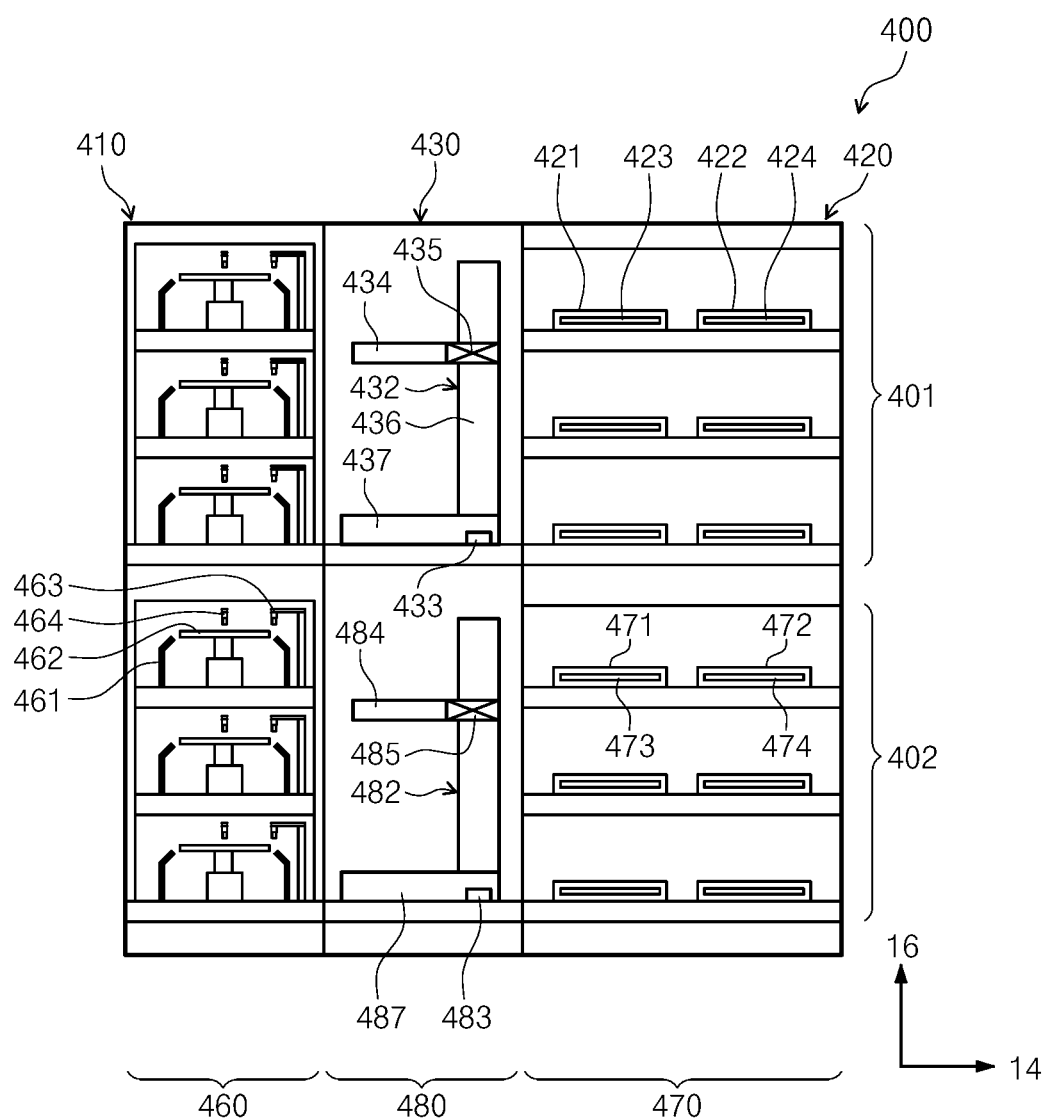
FIG. 3 is a sectional view of the system of FIG. 1, taken along line B-B of FIG. 1.
Figure 4:
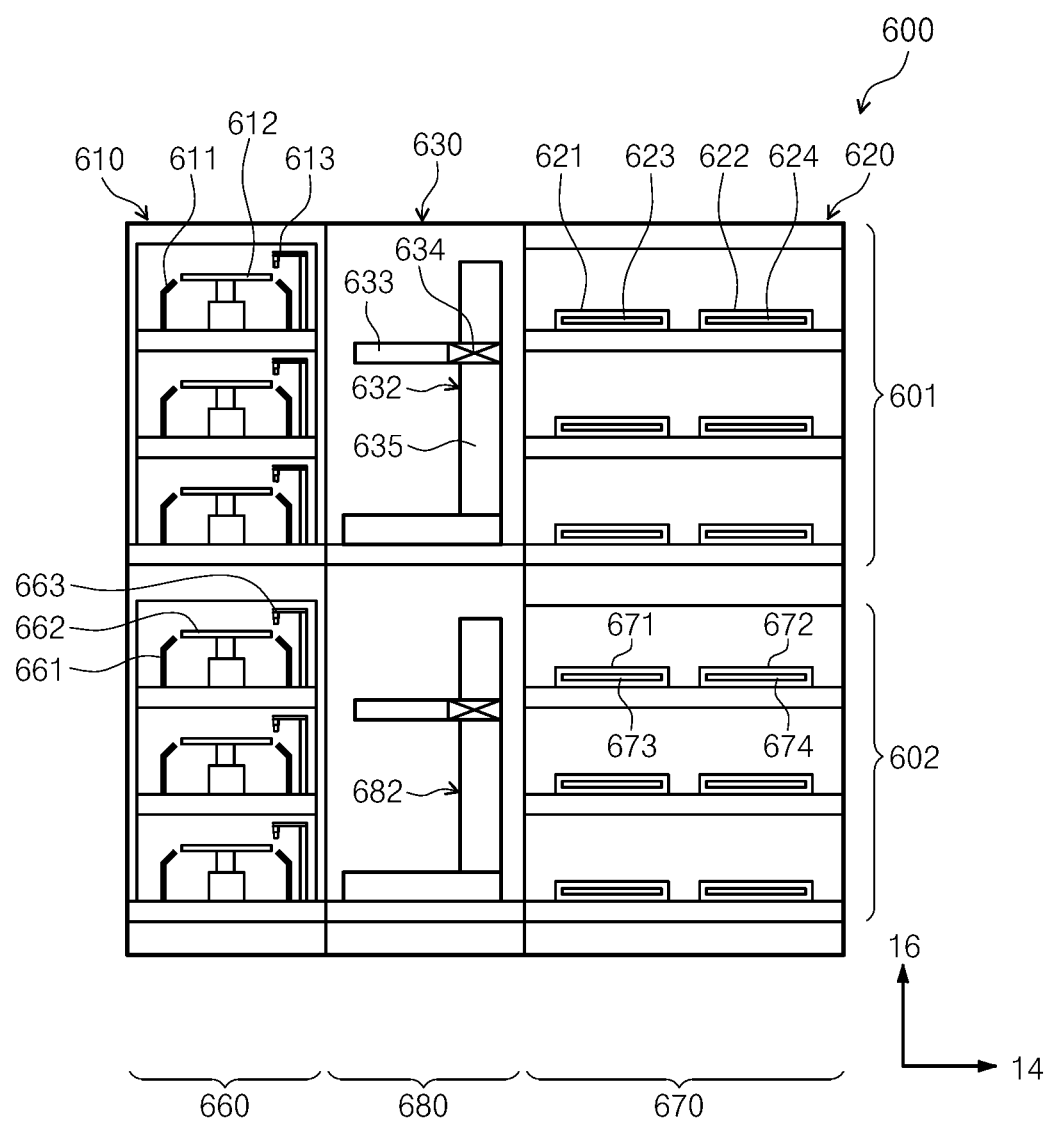
FIG. 4 is a sectional view of the facility of FIG. 1, taken along a line C-C of FIG. 1.

FIGS. 1 to 4 are views schematically illustrating a substrate treating apparatus according to an embodiment of the inventive concept. FIG. 1 is a view of a substrate treating apparatus, viewed from the top. FIG. 2 is a sectional view of the facility of FIG. 1, taken along line A-A of FIG. 1. FIG. 3 is a sectional view of the system of FIG. 1, taken along line B-B of FIG. 1. FIG. 4 is a sectional view of the facility of FIG. 1, taken along a line C-C of FIG. 1.

Referring to FIGS. 1 to 4, the substrate treating apparatus 1 includes a load port 100, an index module 200, a first buffer module 300, an application/development module 400, a second buffer module 500, a pre/post-exposure treating module 600, an interface module 700, a purge module 800, and a controller 1000. The load port 100, the index module 200, the first buffer module 300, the application/development module 400, the second buffer module 500, the pre/post-exposure treating module 600, and the interface module 700 are sequentially disposed in a row in one direction. The purge module 800 may be provided in the interface module 700, and alternatively, the purge module 800 may be provided at various locations, such as a location at which an exposure apparatus 900 at a rear end of the interface module 700 is connected or a lateral side of the interface module 700.

Hereinafter, a direction in which the load port 100, the index module 200, the first buffer module 300, the application/development module 400, the second buffer module 500, the pre/post-exposure treating module 600, and the interface module 700 are disposed will be referred to as a first direction 12, and a direction that is perpendicular to the first direction 12 when viewed from the top will be referred to as a second direction 14, and a direction that is perpendicular to the first direction 12 and the second direction 14 will be referred to as a third direction 16.

A wafer W is moved while being received in a cassette 20. Then, the cassette 20 has a structure that is sealed from the outside. For example, a front open unified pod (FOUP) that has a door on the front side may be used as the cassette 20.

Hereinafter, the load port 100, the index module 200, the first buffer module 300, the application/development module 400, the second buffer module 500, the pre/post-exposure treating module 600, the interface module 700, and the purge module 800 will be described in detail.

(Load Port)

The load port 100 has a holder 120 on which the cassette 20, in which the wafers W are received, is positioned. A plurality of carriers 120 are provided, and are disposed along the second direction 14 in a row. In FIG. 1, four carriers 120 are provided.

(Index Module)

The index module 200 feeds a wafer W between the cassette 20 positioned on the carrier 120 of the load port 100 and the first buffer module 300.

The index module 200 has a frame 210, an index robot 220, and a guide rail 230. The frame 210 has a substantially rectangular parallelepiped shape having an empty interior, and is disposed between the load part 100 and the first buffer module 300. The frame 210 of the index module 200 may have a height smaller than that of a frame 310 of the first buffer module 300, which will be described below. The index robot 220 and the guide rail 230 are disposed in the frame 210. The index robot 220 has a four-axis driven structure such that a hand 221 that directly handles a wafer W is movable and rotatable in the first direction 12, the second direction 14, and the third direction 16. The index robot 220 has a hand 221, an arm 222, a support 223, and a prop 224. The hand 221 is fixedly installed in the arm 222. The arm 222 has a flexible and rotatable structure. The support 223 is configured such that the lengthwise direction thereof is disposed along the third direction 16. The arm 222 is coupled to the support 223 to be movable along the support 223. The support 223 is fixedly coupled to the prop 224. The guide rail 230 is provided such that the lengthwise direction thereof is disposed along the second direction 14. The prop 224 is coupled to the guide rail 230 to be linearly movable along the guide rail 230. Although not illustrated, the frame 210 is further provided with a door opener that opens and closes a door of the cassette 20.

(First Buffer Module)

The first buffer module 300 has a frame 310, a first buffer 320, a second buffer 330, a cooling chamber 350, and a first buffer robot 360. The frame 310 has a rectangular parallelepiped shape having an empty interior, and is disposed between the index module 200 and the application/development module 400. The first buffer 320, the second buffer 330, the cooling chamber 350, and the first buffer robot 360 are situated within the frame 310. The cooling chamber 350, the second buffer 330, and the first buffer 320 are disposed along the third direction 16 sequentially from the bottom. The first buffer 320 is situated at a height corresponding to an application module 401 of the application/development module 400, which will be described below, and the second buffer 330 and the cooling chamber 350 are situated at a height corresponding to a development module 402 of the application/development module 400, which will be described below. The first buffer robot 360 is spaced apart by a predetermined distance in the second direction 14 from the second buffer 330, the cooling chamber 350, and the first buffer 320.

The first buffer 320 and the second buffer 330 temporarily preserve a plurality of wafers W. The second buffer 330 has a housing 331 and a plurality of supports 332. The supports 332 are disposed within the housing 331, and are spaced apart from one another along the third direction 16. One wafer W is positioned on each of the supports 332. The housing has openings (not illustrated) on a side on which the index robot 220 is provided, on a side on which the first buffer robot 360 is provided, and on a side on which a development robot 482 is provided so that the index robot 220, the first buffer robot 360, and a development robot 482 of the development module 402, which will be described below, carry a wafer W into or out of the support 332 in the housing 331. The first buffer 320 has a structure that is substantially similar to that of the second buffer 330. Meanwhile, the housing 321 of the first buffer 320 has an opening on a side on which the first buffer robot 360 is provided and on a side on which an application robot 432 situated in the application module 401, which will be described below, is provided. The number of supports 322 provided for the first buffer 320 and the number of supports 332 provided for the second buffer 330 may be the same or different. According to an embodiment, the number of the supports 332 provided for the second buffer 330 may be larger than the number of the supports 322 provided for the first buffer 320.

The first buffer robot 360 feeds a wafer W between the first buffer 320 and the second buffer 330. The first buffer robot 360 has a hand 361, an arm 362, and a support 363. The hand 361 is fixedly installed in the arm 362. The arm 362 has a flexible structure, and allows the hand 361 to be moved along the second direction 14. The arm 362 is coupled to the support 363 to be linearly movable in the third direction 16 along the support 363. The support 363 has a length extending from a location corresponding to the second buffer 330 to a location corresponding to the first buffer 320. The support 363 may be provided to extend longer upwards or downwards. The first buffer robot 360 may be provided such that the hand 361 is simply two-axis driven along the second direction 14 and the third direction 16.

The cooling chamber 350 cools a wafer W. The cooling chamber 350 has a housing 351 and a cooling plate 352. The cooling plate 352 has a cooling unit 353 that cools an upper surface thereof on which a wafer W is positioned and the wafer W. Various types such as a cooling type using cooling water and a cooling type using a thermoelectric element may be used as the cooling unit 353. A lift pin assembly (not illustrated) that locates a wafer W on the cooling plate 352 may be provided in the cooling chamber 350. The housing 351 has openings (not illustrated) on a side on which the index robot 220 is provided and on a side on which the development robot 482 is provided so that the index robot 220 and the development robot 482 provided for the development module 402, which will be described below, carry a wafer W into or out of the cooling plate 352. Doors (not illustrated) that open and close the aforementioned openings may be provided in the cooling chamber 350.

(Coating/Development Module)

The application/development module 400 performs a process of applying a photoresist onto a wafer W before an exposure process and a process of developing the wafer W after the exposure process. The application/development module 400 has a substantially rectangular parallelepiped shape. The application/development module 400 has an application module 401 and a development module 402. The application module 401 and the development module 402 may be disposed to be partitioned from each other in different layers. According to an example, the application module 401 is situated on the development module 402.

The application module 401 performs a process of applying a photosensitive liquid such as a photoresist onto a wafer W and a heat treating process of, for example, heating and cooling the wafer W before and after the resist applying process. The application module 401 has a resist applying chamber 410, a bake chamber 420, and a carrying chamber 430. The resist applying chamber 410, the bake chamber 420, and the carrying chamber 430 are sequentially disposed along the second direction 14. Accordingly, the resist applying chamber 410 and the bake chamber 420 are spaced apart from each other in the second direction 14 while the carrying chamber 430 is interposed therebetween. A plurality of resist applying chambers 410 may be provided, and a plurality of resist applying chambers 410 may be provided in each of the first direction 12 and the third direction 16. In the drawings, six resist applying chambers 410 are illustrated as an example. A plurality of bake chamber 420 may be provided in each of the first direction 12 and the third direction 16. In the drawings, six bake chambers 420 are illustrated as an example. However, unlike this, a larger number of bake chambers 420 may be provided.

The carrying chamber 430 is situated in parallel to the first buffer 320 of the first buffer module 300 in the first direction 12. An application robot 432 and a guide rail 433 may be situated in the carrying chamber 430. The carrying chamber 430 has a substantially rectangular shape. The application robot 432 feeds a wafer W between the bake chambers 420, the resist applying chambers 400, the first buffer 320 of the first buffer module 300, and the first cooling chamber 520 of the second buffer module 500. The guide rail 433 is disposed such that the lengthwise direction thereof is parallel to the first direction 12. The guide rail 433 guides the application robot 432 such that the application robot 432 is linearly moved in the first direction 12. The application robot 432 has a hand 434, an arm 435, a support 436, and a prop 437. The hand 434 is fixedly installed in the arm 435. The arm 435 has a flexible structure such that the hand 434 is movable horizontally. The support 436 is provided such that the lengthwise direction thereof is disposed along the third direction 16. The arm 435 is coupled to the support 436 to be linearly movable in the third direction 16 along the support 436. The support 436 is fixedly coupled to the prop 437, and the prop 437 is coupled to the guide rail 433 to be movable along the guide rail 433.

The resist applying chambers 410 have the same structure. However, the types of photoresists used in the resist applying chambers 410 may be different. As an example, the photoresist may be a chemical amplification resist. The resist applying chamber 410 applies a photoresist onto the wafer W.

The bake chamber 420 heat-treats the wafer W. For example, the bake chambers 420 perform a prebake process of eliminating organic substances and moisture on the surface of the wafer W by heating the wafer W at a predetermined temperature before a photoresist is applied or a soft bake process performed after a photoresist is applied onto the wafer W, and performs a cooling process of cooling the wafer W after the heating processes. The bake chamber 420 has a cooling plate 421 and a heating plate 422. The cooling plate 421 is provided with a cooling unit 423 such as cooling water or a thermoelectric element. The heating plate 422 is provided with a heating unit 424 such as a heating wire or a thermoelectric element. The cooling plate 421 and the heating plate 422 may be provided in one bake chamber 420. Optionally, some of the bake chambers 420 may include only a cooling plate 421, and some of the bake chambers 422 may include only a heating plate 422.

The development module 402 performs a development process of eliminating a photoresist by supplying a development liquid to obtain a pattern on the wafer W, and a heat treating process, such as heating and cooling, which are performed on the wafer W before and after the development process. The development module 402 has a development chamber 460, a bake chamber 470, and a carrying chamber 480. The development chamber 460, the bake chamber 470, and the carrying chamber 480 are sequentially disposed along the second direction 14. Accordingly, the development chamber 460 and the bake chamber 470 are spaced apart from each other in the second direction 14 while the carrying chamber 480 is interposed therebetween. A plurality of development chambers 460 may be provided, and a plurality of development chambers 460 may be provided in each of the first direction 12 and the third direction 16. In the drawings, six development chambers 460 are illustrated as an example. A plurality of bake chamber 470 may be provided in each of the first direction 12 and the third direction 16. In the drawings, six bake chambers 470 are illustrated as an example. However, unlike this, a larger number of bake chambers 470 may be provided.

The carrying chamber 480 is situated in parallel to the second buffer 330 of the first buffer module 300 in the first direction 12. A development robot 482 and a guide rail 483 may be situated in the carrying chamber 480. The carrying chamber 480 has a substantially rectangular shape. The development robot 482 feeds the wafer W between the bake chambers 470, the development chambers 460, the second buffer 330 and the cooling chamber 350 of the first buffer module 300, and the second cooling chamber 540 of the second buffer module 500. The guide rail 483 is disposed such that the lengthwise direction thereof is parallel to the first direction 12. The guide rail 483 guides the development robot 482 such that the development robot 432 is linearly moved in the first direction 12. The development robot 482 has a hand 484, an arm 485, a support 486, and a prop 487. The hand 484 is fixedly installed in the arm 485. The arm 485 has a flexible structure such that the hand 484 is movable horizontally. The support 486 is provided such that the lengthwise direction thereof is disposed along the third direction 16. The arm 485 is coupled to the support 486 to be linearly movable in the third direction 16 along the support 486. The support 486 is fixedly coupled to the prop 487. The prop 487 is coupled to the guide rail 483 to be linearly movable along the guide rail 483.

The development chambers 460 have the same structure. However, the types of development liquids used in the development chambers 460 may be different. The development chambers 460 eliminate an area of the photoresist on the wafer W, to which light is irradiated. Then, an area of the protective film, to which light is irradiated, is eliminated together. Optionally, only an area of the photoresist and the protective film, to which light is not irradiated, may be eliminated according to the type of the used photoresist.

The development chamber 460 has a housing 461, a support plate 462, and a nozzle 463. The housing 461 has an open-topped cup shape. The support plate 462 is situated in the housing 461, and supports the wafer W. The support plate 462 may be provided to be rotatable. The nozzle 463 supplies a development liquid onto the wafer W positioned on the support plate 462. The nozzle 463 may have a circular pipe shape, and may supply a development liquid to the center of the wafer W. Optionally, the nozzle 463 may have a length corresponding to the diameter of the wafer W, and the discharge hole of the nozzle 463 may be a slit. The development chamber 460 may be further provided with a nozzle 464 that supplies a cleaning liquid such as deionized water to clean the surface of the wafer W, to which the development liquid is additionally supplied.

The bake chamber 470 heat-treats the wafer W. For example, the bake chambers 470 may perform a post bake process of heating the wafer W before the development process, a hard bake process of heating the wafer W after the development process, and a cooling process of cooling the heated wafer after the bake process. The bake chamber 470 has a cooling plate 471 and a heating plate 472. The cooling plate 471 is provided with a cooling unit 473 such as cooling water or a thermoelectric element. The heating plate 472 is provided with a heating unit 474 such as a heating wire or a thermoelectric element. The cooling plate 471 and the heating plate 472 may be provided in one bake chamber 470. Optionally, some of the bake chambers 470 may include only a cooling plate 471, and some of the bake chambers 470 may include only a heating plate 472.

As described above, the application/development module 400 is provided such that the application module 401 and the development module 402 are separated. When viewed from the top, the application module 401 and the development module 402 may have the same chamber disposition.

(Second Buffer Module)

The second buffer module 500 is provided as a passage through which the wafer W is transported, between the application/development module 400 and the pre/post-exposure module 600. The second buffer module 500 performs a process such as a cooling process or an edge exposing process on the wafer W. The second buffer module 500 has a frame 510, a buffer 520, a first cooling chamber 530, a second cooling chamber 540, an edge exposing chamber 550, and a second buffer robot 560. The frame 510 has a rectangular parallelepiped shape. The buffer 520, the first cooling chamber 530, the second cooling chamber 540, the edge exposing chamber 550, and the second buffer robot 560 are situated in the frame 510. The buffer 520, the first cooling chamber 530, and the edge exposing chamber 550 are disposed at a height corresponding to the application module 401. The second cooling chamber 540 is disposed at a height corresponding to the development module 402. The buffer 520, the first cooling chamber 530, and the second cooling chamber 540 are disposed in a row along the third direction 16. When viewed from the top, the buffer 520 is disposed along the carrying chamber 430 of the application module 401 in the first direction 12. The edge exposing chamber 550 is spaced apart from the buffer 520 or the first cooling chamber 530 by a predetermined distance in the second direction 14.

The second buffer robot 560 transports the wafer W between the buffer 520, the first cooling chamber 530, and the edge exposing chamber 550. The second buffer robot 560 is situated between the edge exposing chamber 550 and the buffer 520. The second buffer robot 560 may have a structure that is similar to that of the first buffer robot 360.

The first cooling chamber 530 and the edge exposing chamber 550 perform a succeeding process on the wafers, on which the application module 401 has performed a process. The first cooling chamber 530 cools the wafer W, on which the application module 401 has performed a process. The first cooling chamber 530 has a structure similar to that of the cooling chamber 350 of the first buffer module 300. The edge exposing chamber 550 exposes peripheries of the wafers W, on which the first cooling chamber 530 has performed a cooling process. The buffer 520 temporarily preserves the substrates W before the wafers W, on which the edge exposing chamber 550 has performed a process, are transported to a pre-treatment module 601, which will be described below. The second cooling chamber 540 cools the wafers W before the wafers W, on which a post-treatment module 602, which will be described below, has performed a process, are transported to the development module 402. The second buffer module 500 may further have a buffer at a height corresponding to the development module 402. In this case, the wafers W, on which the post-treatment module 602 has performed a process, may be transported to the development module 402 after being temporarily preserved in the added buffer.

(Pre/Post-Exposure Module)

When the exposure apparatus 900 performs an immersion/exposure process, the pre/post-exposure module 600 may perform a process of applying a protective film that protects the photoresist film applied to the wafer W during the immersion/exposure process. The pre/post-exposure module 600 may perform a process of cleaning the wafer W after the exposure process. Furthermore, when the application process is performed by using a chemical amplification resist, the pre/post-exposure module 600 may perform a bake process after the exposure process.

The pre/post-exposure module 600 has a pre-treatment module 601 and a post-treatment module 602. The pre-treatment module 601 performs a process of treating the wafer W before the exposure process, and the post-treatment module 602 performs a process of treating the wafer W after the exposure process. The pre-treatment module 601 and the post-treatment module 602 may be disposed to be partitioned from each other in different layers. According to an example, the pre-treatment module 601 is situated on the post-treatment module 602. The pre-treatment module 601 has the same height as that of the application module 401. The post-treatment module 602 has the same height as that of the development module 402. The pre-treatment module 601 has a protective film applying chamber 610, a bake chamber 620, and a carrying chamber 630. The protective film applying chamber 610, the carrying chamber 630, and the bake chamber 620 are sequentially disposed along the second direction 14. Accordingly, the protective film applying chamber 610 and the bake chamber 620 are spaced apart from each other in the second direction 14 while the carrying chamber 630 is interposed therebetween. A plurality of protective film applying chambers 610 are provided, and the plurality of protective film applying chambers 610 are disposed along the third direction 16 to form different layers. Optionally, a plurality of protective film applying chambers 610 may be provided in each of the first direction 12 and the third direction 16. A plurality of bake chambers 620 are provided, and the plurality of bake chambers 610 are disposed along the third direction 16 to form different layers. Optionally, a plurality of bake chambers 620 may be provided in each of the first direction 12 and the third direction 16.

The carrying chamber 630 is situated in parallel to the first cooling chamber 530 of the second buffer module 500 in the first direction 12. A pre-treatment robot 632 is situated in the carrying chamber 630. The carrying chamber 630 has a substantially square or rectangular shape. The pre-treatment robot 632 feeds the wafer W between the protective film applying chambers 610, the bake chambers 620, the buffer 520 of the second buffer module 500, and a first buffer 720 of the interface module 700, which will be described below. The pre-treatment robot 632 has a hand 633, an arm 634, and a support 635. The hand 633 is fixedly installed in the arm 634. The arm 634 has a flexible and rotatable structure. The arm 634 is coupled to the support 635 to be linearly movable in the third direction 16 along the support 635.

The protective film applying chamber 610 applies a protective film that protects a resist film during the immersion/exposure process, onto the wafer W. The protective film applying chamber 610 has a housing 611, a support plate 612, and a nozzle 613. The housing 611 has an open-topped cup shape. The support plate 612 is situated in the housing 611, and supports the wafer W. The support plate 612 may be provided to be rotatable. The nozzle 613 supplies a protection liquid for forming a protective film onto the wafer W positioned on the support plate 612. The nozzle 613 has a circular pipe shape, and may supply a protection liquid to the center of the wafer W. Optionally, the nozzle 613 may have a length corresponding to the diameter of the wafer W, and the discharge hole of the nozzle 613 may be a slit. In this case, the support plate 612 may be provided in a fixed state. The protection liquid includes an expandable material. The protection liquid may be a material that has a low affinity for a photoresist and water. For example, the protection liquid may include a fluorine-based solvent. The protective film applying chamber 610 supplies a protection liquid to a central area of the wafer W while rotating the wafer W positioned on the support plate 612.

The bake chamber 620 heat-treats the wafer W, to which the protective film is applied. The bake chamber 620 has a cooling plate 621 and a heating plate 622. The cooling plate 621 is provided with a cooling unit 623 such as cooling water or a thermoelectric element. The heating plate 622 is provided with a heating unit 624 such as a heating wire or a thermoelectric element. The heating plate 622 and the cooling plate 621 may be provided in one bake chamber 620. Optionally, some of the bake chambers 620 may include only a heating plate 622, and some of the bake chambers 620 may include only a cooling plate 621.

The post-treatment module 602 has a cleaning chamber 660, a post-exposure bake chamber 670, and a carrying chamber 680. The cleaning chamber 660, the carrying chamber 680, and the post-exposure chamber 670 are sequentially disposed along the second direction 14. Accordingly, the cleaning chamber 660 and the post-exposure bake chamber 670 are spaced apart from each other in the second direction 14 while the carrying chamber 680 is interposed therebetween. A plurality of cleaning chambers 660 are provided, and the plurality of cleaning chambers 610 are disposed along the third direction 16 to form different layers. Optionally, a plurality of cleaning chambers 660 may be provided in each of the first direction 12 and the third direction 16. A plurality of post-exposure bake chambers 670 are provided, and the plurality of post-exposure bake chambers 610 are disposed along the third direction 16 to form different layers. Optionally, a plurality of post-exposure bake chambers 670 may be provided in plural in each of the first direction 12 and the third direction 16.

When viewed from the top, the carrying chamber 680 is situated in parallel to the second cooling chamber 540 of the second buffer module 500 in the first direction 12. The carrying chamber 680 has a substantially square or rectangular shape. A post-treatment robot 682 is situated in the carrying chamber 680. The post-treatment robot 682 transports the wafer W between the cleaning chambers 660, the post-exposure bake chambers 670, the second cooling chamber 540 of the second buffer module 500, and a second buffer 730 of the interface module 700, which will be described below. The post-treatment robot 682 provided in the post-treatment module 602 may have the same structure as that of the pre-treatment robot 632 provided in the pre-treatment module 601.

The cleaning chamber 660 cleans the wafer W after the exposure process. The cleaning chamber 660 has a housing 661, a support plate 662, and a nozzle 663. The housing 661 has an open-topped cup shape. The support plate 662 is situated in the housing 661, and supports the wafer W. The support plate 662 may be provided to be rotatable. The nozzle 663 supplies a cleaning liquid onto the wafer W positioned on the support plate 662. The cleaning liquid may be water such as deionized water. The cleaning chamber 660 supplies a cleaning liquid to a central area of the wafer W while rotating the wafer W positioned on the support plate 662. Optionally, the nozzle 663 may be linearly moved or rotated from a central area to a peripheral area of the wafer W while the wafer W is rotated.

After the exposure process, the bake chamber 670 heats the wafer W, on which the exposure process has been performed, by using a far infrared ray. After the exposure process, in the bake process, the wafer W is heated to finish a property change of the photoresist by amplifying acid produced in the photoresist through the exposure process. After the exposure process, the bake chamber 670 has a heating plate 672. The heating plate 672 is provided with a heating unit 674 such as a heating wire or a thermoelectric element. After the exposure process, the bake chamber 670 may be further provided with a cooling plate 671 in the interior thereof. The cooling plate 671 is provided with a cooling unit 673 such as cooling water or a thermoelectric element. Optionally, a bake chamber having only a cooling plate 671 may be further provided.

As described above, the pre/post-exposure module 600 is provided such that the pre-treatment module 601 and the post-treatment module 602 are completely separated from each other. The carrying chamber 630 of the pre-treatment module 601 and the carrying chamber 680 of the post-treatment module 602 may have the same size, and may completely overlap each other when viewed from the top. The protective film applying chamber 610 and the cleaning chamber 660 may have the same size, and may completely overlap with each other when viewed from the top. The bake chamber 620 and the post-exposure chamber 670 may have the same size, and may completely overlap with each other when viewed from the top.

(Interface Module)

The interface module 700 feeds the wafer W between two of the pre/post-exposure module 600, the purge module 800, and the exposure apparatus 900. The interface module 700 has a frame 710, a first buffer 720, a second buffer 730, and an interface robot 740. The first buffer 720, the second buffer 730, and the interface robot 740 are situated within the frame 710. The first buffer 720 and the second buffer 730 are spaced apart from each other by a predetermined distance, and may be stacked. The first buffer 720 is disposed at a location higher than the second buffer 730. The first buffer 720 is situated at a height corresponding to the pre-treatment module 601, and the second buffer 730 is disposed at a height corresponding to the post-treatment module 602. When viewed from the top, the first buffer 720 is disposed along the first direction 12 while forming a row with the carrying chamber 630 of the pre-treatment module 601, and the second buffer 730 is disposed along the first direction 12 forming a row with the carrying chamber 630 of the post-treatment module 602.

The interface robot 740 is situated to be spaced apart from the first buffer 720 and the second buffer 730 in the second direction 14. The interface robot 740 transports the wafer W between two of the first buffer 720, the second buffer 730, the purge module 800, and the exposure apparatus 900. The interface robot 740 has a structure that is substantially similar to that of the second buffer robot 560.

The first buffer 720 temporarily preserves the wafers W, on which the pre-treatment module 601 has performed a process, before they are moved to the exposure apparatus 900. The second buffer 730 temporarily preserves the wafers W, on which the exposure apparatus 900 has completely performed a process, before they are moved to the post-treatment module 602. The first buffer 720 has a housing 721 and a plurality of supports 722. The supports 722 are disposed within the housing 721, and are spaced apart from one another along the third direction 16. One wafer W is positioned on each of the supports 722. The housing 721 has openings (not illustrated) on a side on which the interface robot 740 is provided and on a side on which the pre-treatment robot 632 is provided so that the interface robot 740 and the pre-treatment robot 632 carry a wafer W into or out of the housing 721. The second buffer 730 has a structure that is substantially similar to that of the first buffer 720. Meanwhile, the housing 4531 of the second buffer 730 has openings on a side on which the interface robot 740 is provided and on a side on which the post-treatment robot 682 is provided. The interface module may be provided only with buffers and a robot as described above while a chamber that performs a certain process on a wafer is not provided.

(Purge Module)

The purge module 800 may be disposed in the interface module 700. In detail, the purge module 800 may be disposed at a location that is opposite to the first buffer 720 around the interface robot 740. Unlike this, the purge module 800 may be provided at various locations, such as a location at which the exposure apparatus 900 at a rear end of the interface module 700 is connected or a lateral side of the interface module 700. The purge module 800 performs a gas purging process and a rinsing process on the water on which a protective film for protecting a photoresist is coated in the pre/post-exposure module 600.

The controller (1000 of FIG. 11) controls the components of the substrate treating apparatus 1000.

Figure 5:
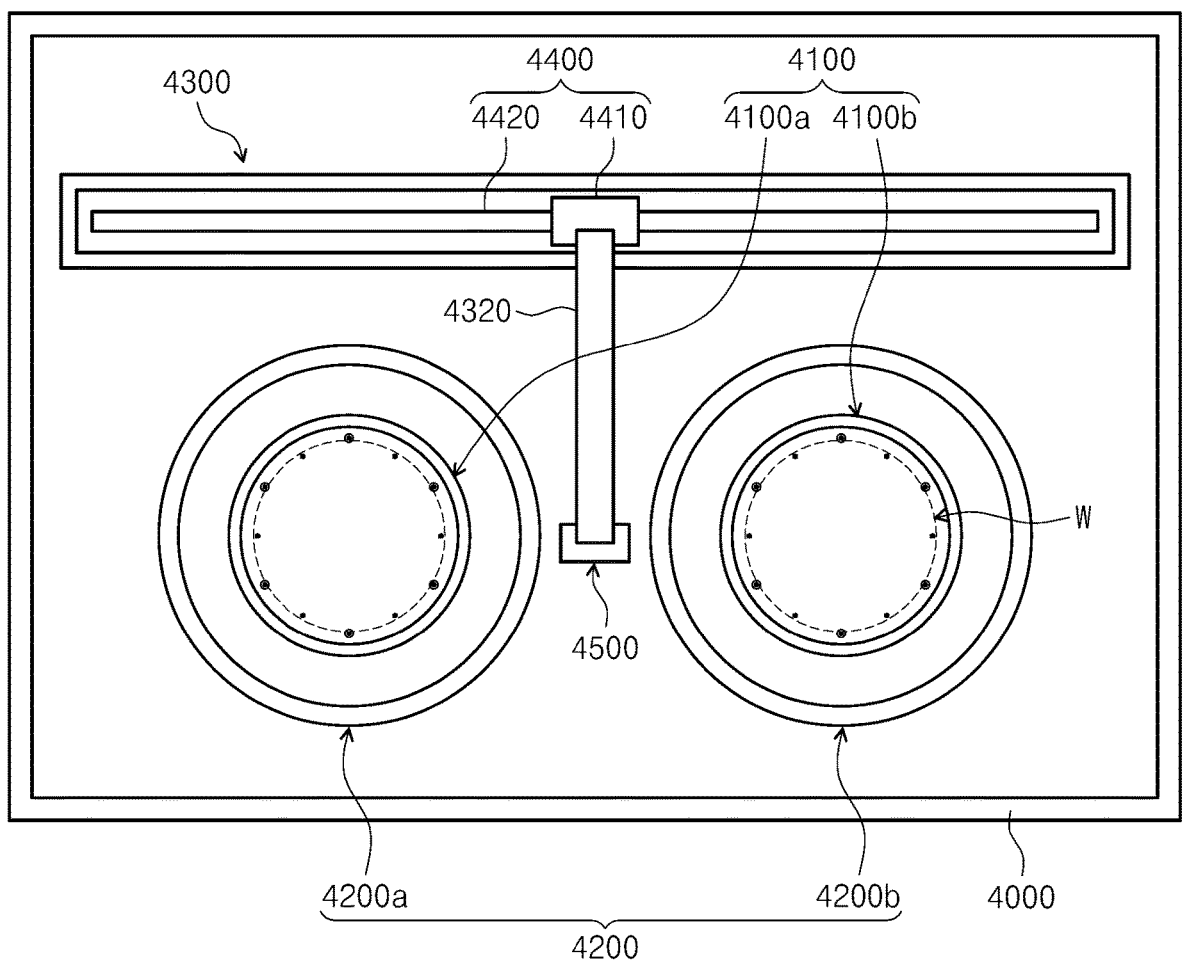
FIG. 5 is a plan view of a resist coating chamber according to an embodiment of the inventive concept.
Figure 6:
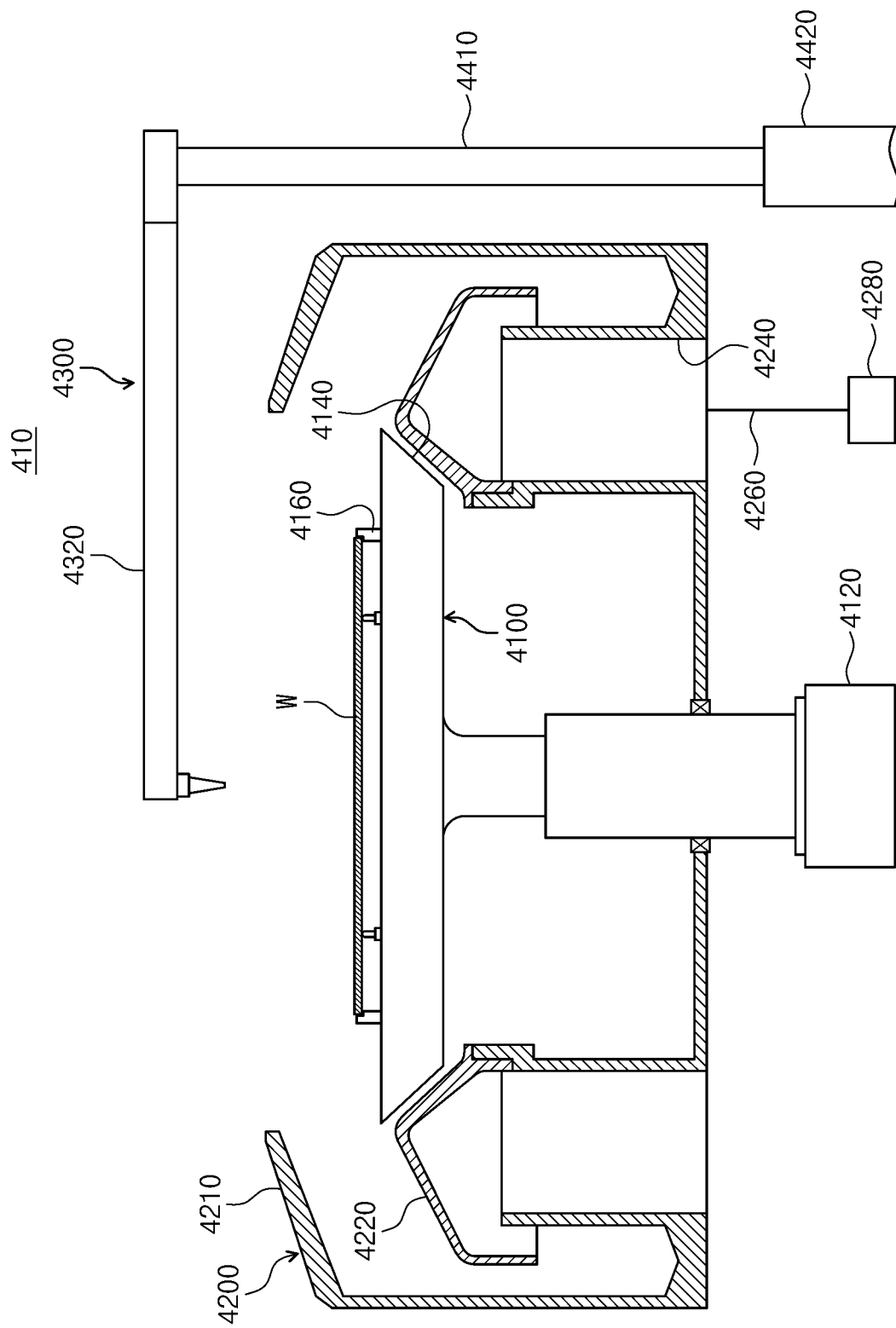
FIG. 6 is a side sectional view of the resist coating chamber of FIG. 5.

FIG. 5 is a plan view of a resist coating chamber according to an embodiment of the inventive concept. FIG. 6 is a side sectional view of the resist coating chamber of FIG. 5.

Referring to FIGS. 5 and 6, the resist coating chamber 410 includes a substrate support member 4100, a treatment liquid supply unit 4300, and a purge port 4500.

The substrate support member 4100 supports the substrate W during execution of the process.

The substrate support member 4100 includes a first substrate support member 4100a and a second substrate support member 4100b.

Two substrate support members, that is, the first substrate support members 4100 and the second substrate support member 4100*b* are provided inside the housing 4000 that provides a treatment space, along the movement direction of a nozzle arm 4320.

The substrate support member 4100 is rotated by a substrate support driving member 4120 while the process is executed. The substrate support member 4100 has a support plate 4140 having a circular upper surface, and pin members 4160 that support the substrate W are installed on the upper surface of the support plate 4140. The substrate W supported by the pin members 4160 is rotated as the substrate support member 4100 is rotated by the substrate support driving member 4120.

A container 4200 is located at a circumference of the substrate support member 4100. The container 4200 includes a first container 4200*a* located at a circumference of the first substrate support member 4100*a* and a second container 4200*b* located at a circumference of the second substrate support member 4100*b*.

The container 4200 may have a substantially cylindrical shape. The container 4200 includes an upper cup 4210. An exhaust hole is formed below the upper cup 4210. A lower cup 4220 may be provided below the upper cup 4210 to be spaced apart from the upper cup 4210 at a preset interval. The lower cup 4220 forms a lower end of the exhaust hole. A communication hole 4240 connected to the exhaust hole is formed at a lower portion of the container 4200, and an exhaust pipe 4260 is installed to be communicated with the communication hole 4240. An exhaust member 4280, such as a pump 4327, is connected to the exhaust pipe 4260, and a negative pressure is provided in the exhaust member 4280 such that the treatment liquid that is scattered due to the rotation of the substrate W and the gases in the container 4200 containing fumes are exhausted.

Figure 7:
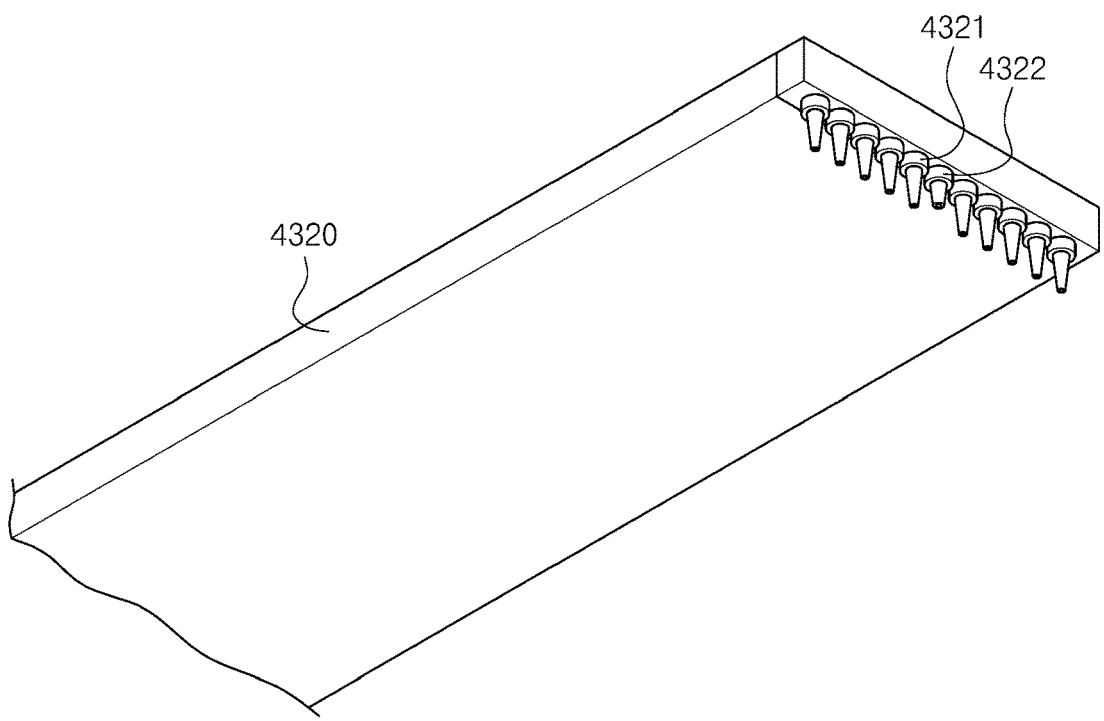
FIG. 7 is a perspective view of a nozzle arm of FIG. 5.

FIG. 7 is a perspective view of a nozzle arm of FIG. 5.

Referring to FIGS. 5 to 7, the treatment liquid supply unit 4300 supplies a treatment liquid to an upper surface of a substrate W positioned on the substrate support member 4100. The treatment liquid supply unit 4300 has a nozzle arm 4320 provided on one side of the substrate support member 4100. A plurality of nozzles 4321 and 4322 are located at one end of the nozzle arm 4320. The nozzle 4321 and 4322 include a plurality of photosensitive liquid nozzles 4321. The plurality of photosensitive liquid nozzles 4321 may be disposed in a row at one end of the nozzle arm 4320 to be perpendicular to a lengthwise direction of the nozzle arm 4320.

A pre-wet nozzle 4322 may be provided at an end of the nozzle arm 4320. The pre-wet nozzle 4322 supplies an organic solvent to the substrate W to improve the wetting property of the photosensitive liquid for the substrate W before the photosensitive liquid is supplied to the substrate W. If an organic solvent is supplied before the photosensitive liquid is supplied onto the substrate W, the photosensitive liquid uniformly spreads out onto the substrate W so that a uniform photosensitive film may be formed on the substrate W.

The organic solvent supplied from the pre-wet nozzle 4322 to the substrate W may be thinner or the like.

Further, the pre-wet nozzle 4322 may be omitted.

The nozzle arm 4320 may be disposed on one side of the substrate support member 4100 such that the arrangement direction of the nozzles 4321 and 4322 may pass through the center of the substrate W positioned on the substrate support member 4100.

The nozzle arm 4320 on which the plurality of nozzles 4321 and 4322 are mounted, may be linearly moved along the arrangement direction of the nozzles 4321 and 4322 by the driving member 4400. The driving member 4400 includes a nozzle arm support member 4410 and a guide member 4420. The nozzle arm support member 4410 is coupled to an opposite end of the nozzle arm 4320. The nozzle arm support member 4410 may have a rod shape that extends from one side to a lower side of the nozzle arm 4320. The guide member 4420 is connected to a lower end of the nozzle arm support member 4410. The guide member 4420 is disposed on one side of the substrate support member 4100 to be perpendicular to a lengthwise direction of the nozzle arm 4320 on the plan disposition structure of FIG. 5. The guide member 4420 is located along a spacing direction of the first substrate support member 4100*a* and the second substrate support member 4100*b*. The guide member 4420 may have a rail shape, and guides a linear movement of the nozzle arm support member 4410. The nozzle arm support member 4410 may be provided such that the length of the nozzle arm support member 4410 may vary vertically.

By the driving member 4400 having the above-described configuration, the treatment liquid supply unit 4300 may be moved between the first substrate support member 4100*a* and the second substrate support member 4100*b* while being linearly moved. Accordingly, after being moved to the second substrate support member 4100*b* after the photosensitive liquid is supplied to the substrate located in the first substrate support member 4100*a* with one of the plurality of photosensitive liquid nozzles 4321, the treatment liquid supply unit 4300 may supply the photosensitive liquid to the substrate located in the second substrate support member 4100*b* with one of the plurality of photosensitive liquid nozzles 4321.

The photosensitive liquid nozzle 4321 that supplies the photosensitive liquid to the substrate located in the first substrate support member 4100*a* and the photosensitive liquid nozzle 4321 that supplies the photosensitive liquid to the substrate located in the second substrate support member 4100*b* may be the same or different. Further, the carrying-in of the substrate to the first substrate support member 4100*a* and the carrying-in of the substrate to the second substrate support member 4100*b* may be alternately performed. The process of supplying the photosensitive liquid to the substrate may be repeatedly performed while the nozzle arm 4320 is moved between the first substrate support member 4100*a* and the second substrate support member 4100*b*.

The purge port 4500 is located between the first substrate support member 4100*a* and the second substrate support member 4100*b*. The purge port 4500 is provided such that the nozzle arm 4320 is located below the movement paths of the nozzles 4321 and 4322 when the nozzle arm 4320 is moved between the first substrate support member 4100*a* and the second substrate support member 4100*b*.

Figure 8:
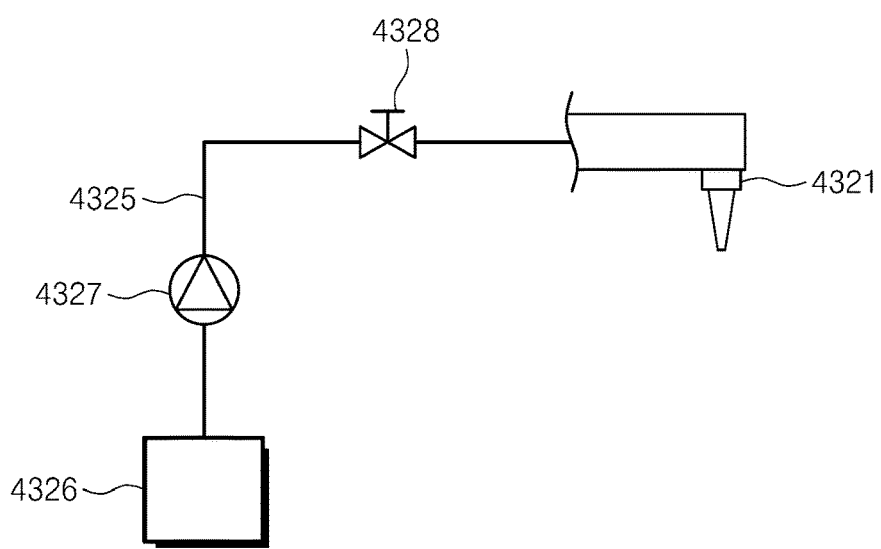
FIG. 8 is a view illustrating a pipeline connected to one of photosensitive liquid nozzles.

FIG. 8 is a view illustrating a pipeline connected to one of photosensitive liquid nozzles.

Referring to FIG. 8, the photosensitive liquid nozzle 4321 is connected to a tank 4326 through a supply pipe 4325. The tank 4326 stores a photosensitive liquid. A pump 4327 that provides a pressure, by which the photosensitive liquid flows, may be located in the supply pipe 4325. A valve 4328 that opens and closes the supply pipe 4325 may be located in the supply pipe 4325. The plurality of photosensitive liquid nozzles 4321 may be individually connected to the pipes. Accordingly, all or some of the plurality of photosensitive liquid nozzles 4321 may supply photosensitive liquids having different compositions to the substrate.

According to the substrate treating apparatus 1, the photosensitive liquid nozzle 4321 has to be purged sometimes during use thereof. This case may include a case in which it is necessary to discharge a photosensitive liquid in the pipeline to remove generated particles, a case in which the pipeline has to become stable after the pump 4327, the valve 4328, and the filter of the pipeline are exchanged, and a case in which the pipeline has to become stable after the photosensitive liquid stored in the tank 4326 is exchanged and a newly exchanged photosensitive liquid is filled in the entire pipeline. The purge operation is performed by discharging a photosensitive liquid of a preset amount through the nozzle 4321, and according to occasions, the amount of the discharged photosensitive liquid may correspond to several amounts of tank 4326 and the photosensitive liquid may be discharged for several hours or several days.

The substrate treating apparatus according to an embodiment of the inventive concept performs a purge operation while performing a process of supplying the photosensitive liquid to the substrate with the nozzle arm 4320.

Figure 9:
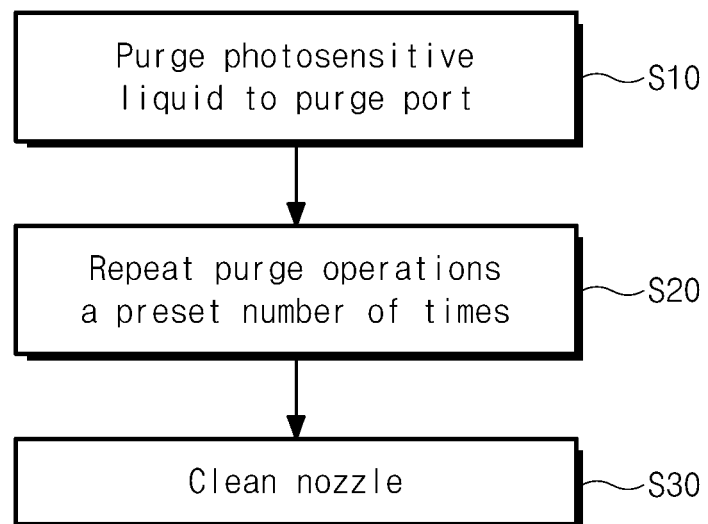
FIG. 9 is a block diagram illustrating a process for a purge operation.
Figure 10:
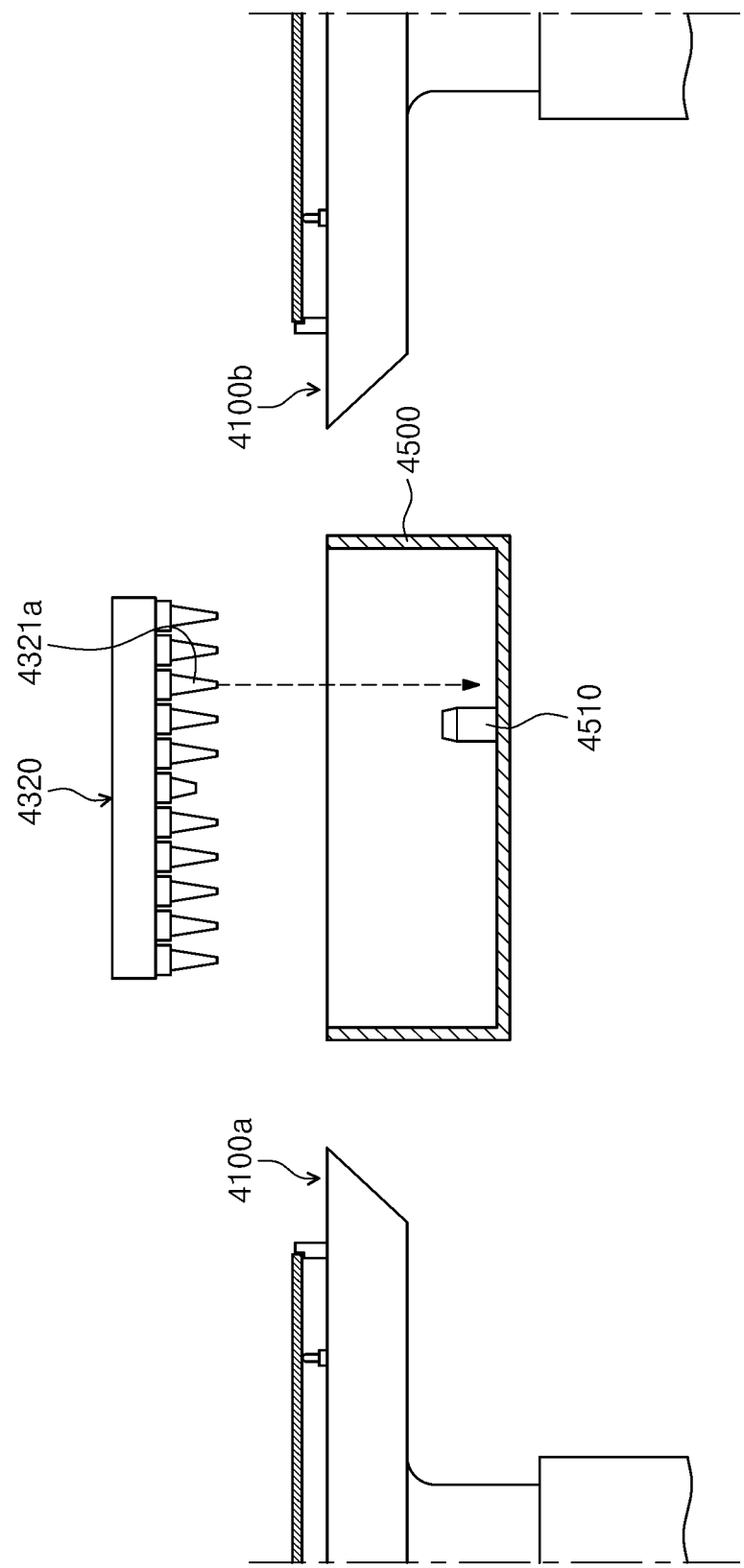
FIG. 10 is a view illustrating a state in which a photosensitive liquid nozzle is purged to a purge port.
Figure 11:
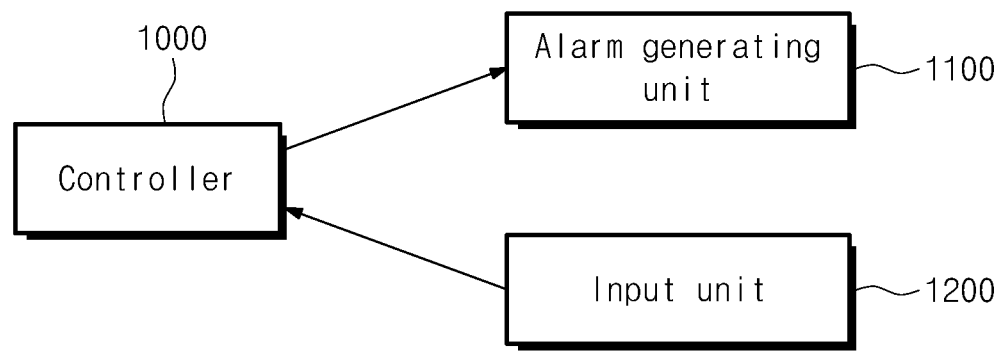
FIG. 11 is a view illustrating some connection relationships of a controller.

FIG. 9 is a block diagram illustrating a process for a purge operation. FIG. 10 is a view illustrating a state in which a photosensitive liquid nozzle is purged to a purge port. FIG. 11 is a view illustrating some connection relationships of a controller.

Hereinafter, a case of initiating a purge operation when the nozzle arm 4320 is moved from the first substrate support member 4100*a* to the second substrate support member 4100*b* will be described as an example. However, the inventive concept is not limited thereto, but the purge operation may be initiated when the nozzle arm 4320 is moved from the second substrate support member 4100*b* to the first substrate support member 4100*a*.

Referring to FIGS. 9 to 11, the controller 1000 controls the components of the substrate treating apparatus 10 for a purge operation, as follows.

The nozzle arm 4320 is located above the first substrate support member 4100*a*, and one of a plurality of photosensitive liquid nozzles 4321 supplies a photosensitive liquid to a substrate. If the photosensitive liquid of a preset amount is completely supplied, the nozzle arm 4320 is moved towards the second substrate support member 4100*b*.

If the nozzle arm 4320 is moved towards the second substrate support member 4100*b* and is vertically arranged with the purge port 4500, the photosensitive liquid nozzle 4321*a* (hereinafter, the purge nozzle), which will perform a purge operation, of the plurality of photosensitive liquid nozzles 4321 performs the purge operation by discharging the photosensitive liquid of a preset amount to the purge port 4500 (S10). When the purge nozzle 4321*a* performs a purge operation, the nozzle arm 4320 may be temporarily stopped above the purge port 4500. Further, when the purge nozzle 4321*a* performs a purge operation, the nozzle arm 4320 may be moved towards the second substrate support member 4100*b* at a preset speed. The purge operation of the purge nozzle 4321*a* is performed while the nozzle arm 4320 is moved from the first substrate support member 4100*a* to the second substrate support member 4100*b*, it hardly influences the operation of treating the substrate while the nozzle arm 4320 is moved from the first substrate support member 4100*a* to the second substrate support member 4100*b*.

If the nozzle arm 4320 is located above the second substrate support member 4100*b*, and one of a plurality of photosensitive liquid nozzles 4321 supplies the photosensitive liquid to the substrate. Then, the photosensitive liquid nozzle 4321 that supplies the photosensitive liquid may be the same as or different from the photosensitive liquid nozzle 4321 that supplied the photosensitive liquid from the first substrate support member 4100*a* shortly before. However, the purge nozzle 4321*a* is excluded from the photosensitive liquid nozzle 4321 that supplies the photosensitive liquid. Accordingly, if it is determined that the photosensitive liquid nozzle 4321 that will supply the photosensitive liquid to the second substrate support member 4100*b* is the same as the purge nozzle 4321*a*, the controller 1000 performs an interlock operation. For example, if it is determined that the photosensitive liquid nozzle 4321 that will supply the photosensitive liquid to the second substrate support member 4100*b* is the same as the purge nozzle 4321*a*, the controller 1000 may generate an alarm through an alarm generating unit 1200. Further, if it is determined that the photosensitive liquid nozzle 4321 that will supply the photosensitive liquid to the second substrate support member 4100*b* is the same as the purge nozzle 4321*a*, the controller 1000 may stop carrying-in of the substrate to the second substrate support member 4100*b*. Further, if it is determined that the photosensitive liquid nozzle 4321 that will supply the photosensitive liquid to the second substrate support member 4100*b* is the same as the purge nozzle 4321*a*, the controller 1000 may stop carrying-out of a substrate that is scheduled to be carried into the second substrate support member 4100*b* from a cassette. If the photosensitive liquid of a preset amount is completely supplied, the nozzle arm 4320 is moved towards the first substrate support member 4100*a*.

If the nozzle arm 4320 is moved towards the first substrate support member 4100*a* and is vertically arranged with the purge port 4500, the purge module 4321*a* performs a purge operation by discharging the photosensitive liquid of a preset amount to the purge port 4500. When the purge nozzle 4321*a* performs a purge operation, the nozzle arm 4320 may be temporarily stopped above the purge port 4500. Further, when the purge nozzle 4321*a* performs a purge operation, the nozzle arm 4320 may be moved towards the first substrate support member 4100*a* at a preset speed.

If the nozzle arm 4320 is located above the first substrate support member 4100*a*, one of a plurality of photosensitive liquid nozzles 4321 supplies a photosensitive liquid to a substrate. Then, the photosensitive liquid nozzle 4321 that supplies the photosensitive liquid may be the same as or different from the photosensitive liquid nozzle 4321 that supplied the photosensitive liquid from the second substrate support member 4100*b* shortly before. The purge nozzle 4321*a* is excluded from the photosensitive liquid nozzle 4321 that supplies the photosensitive liquid. Accordingly, if it is determined that the photosensitive liquid nozzle 4321 that will supply the photosensitive liquid to the first substrate support member 4100*a* is the same as the purge nozzle 4321*a*, the controller 1000 may generate an alarm through an alarm generating unit 1200. Further, if it is determined that the photosensitive liquid nozzle 4321 that will supply the photosensitive liquid to the first substrate support member 4100*a* is the same as the purge nozzle 4321*a*, the controller 1000 may stop carrying-in of the substrate to the first substrate support member 4100*a*. Further, if it is determined that the photosensitive liquid nozzle 4321 that will supply the photosensitive liquid to the first substrate support member 4100*a* is the same as the purge nozzle 4321*a*, the controller 1000 may stop carrying-out of a substrate that is scheduled to be carried into the first substrate support member 4100*a* from a cassette.

Thereafter, when the nozzle arm 4320 supplies the photosensitive liquid to the substrate while being moved between the first substrate support member 4100*a* and the second substrate support member 4100*b*, the purge nozzle 4321*a* repeatedly performs a purge operation (S20). The purge operation of the purge nozzle 4321*a* is repeated a preset number of times until the amount of the photosensitive liquid discharged from the purge nozzle 4321a reaches a preset amount. The number of times may be set or adjusted in a manner in which the operator inputs the number of times through an input unit 1200. Further, the preset number of times may be set differently according to a type in which a purge operation is initiated, such as a purge operation after exchange of the pipelines, a purge operation after exchange of the photosensitive liquids, and a purge operation for removing particles.

Figure 12:
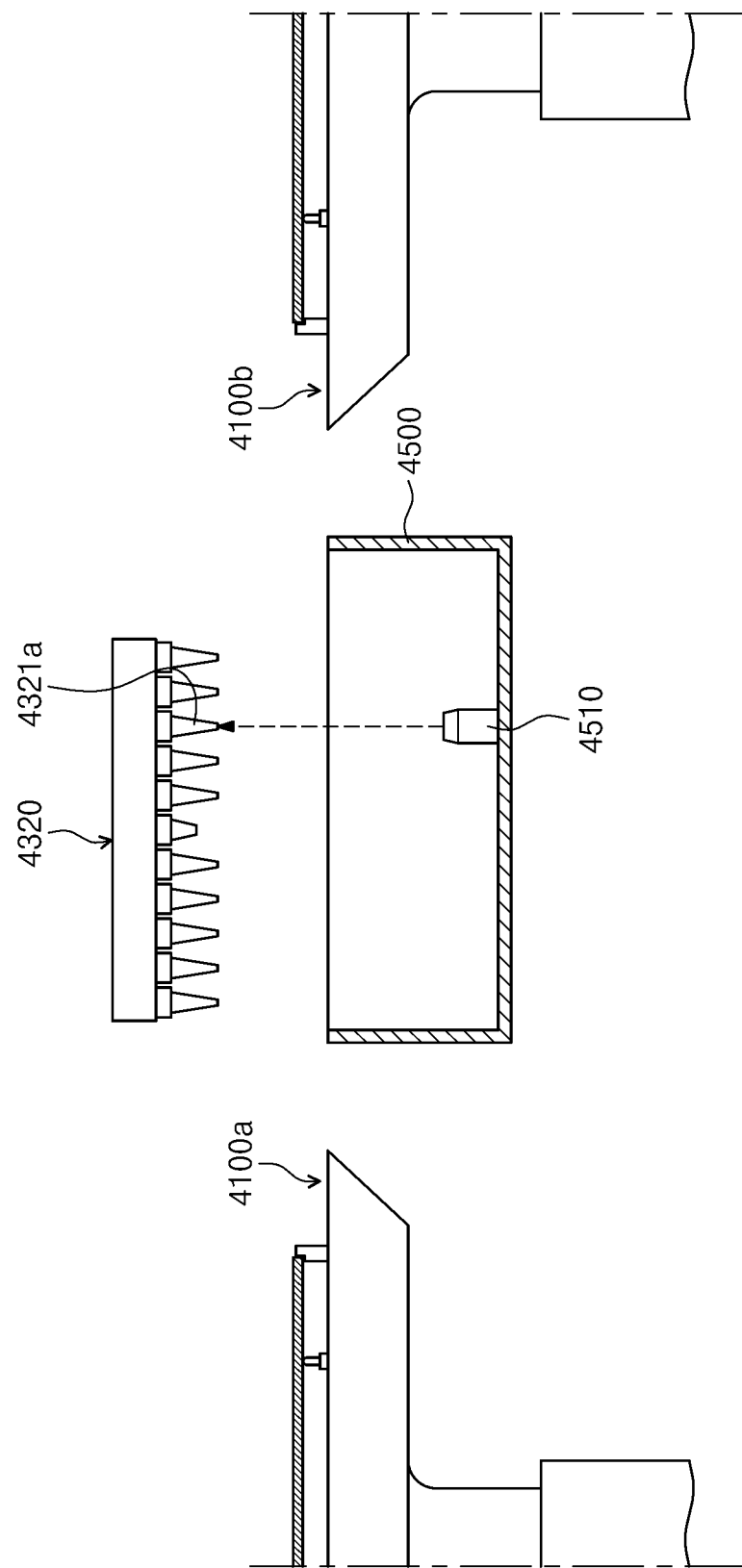
FIG. 12 is a view illustrating a state in which a purge nozzle is being cleaned.

FIG. 12 is a view illustrating a state in which a purge nozzle is being cleaned.

Referring to FIG. 12, the purge port may provide a cleaner 4510. The cleaner 4510 may supply a cleaning liquid to the nozzles 4321 and 4322 to clean the nozzles 4321 and 4322.

If the purge nozzle 4321a purges the photosensitive liquid a preset number of times, the purge port 4500 cleans the purge nozzle 4321a in a process of moving the nozzle arm 4320 from one of the first substrate support member 4100a and the second substrate support member 4100b to the other of the first substrate support member 4100a and the second substrate support member 4100b (S30).

In the above-mentioned example, the case in which the purge operation of the purge nozzle 4321a is continuously performed when the nozzle arm 4320 is moved between the first substrate support member 4100a and the second substrate support member 4100b has been described. However, the purge operation of the purge nozzle 4321a may be intermittently performed. If it is necessary to move the nozzle arm 4320 without any time delay by the purge operation of the purge nozzle 4321a, for example, the substrate is completely promptly carried into the substrate support member 4100 located in the movement direction of the substrate, the nozzle arm 4320 may be moved to the following substrate support member 4100 without any purge operation of the purge nozzle 4321a even after the purge operation is initiated. Further, in a process of moving the nozzle arm 4320 to the following substrate support member 4100, the purge nozzle 4321a may perform a purge operation.

According to an embodiment of the inventive concept, the substrate treating apparatus 10b may perform an operation of purging the photosensitive liquid nozzle 4321 while the treatment liquid supply unit 4300 performs a process of supplying the photosensitive liquid to the substrate. Accordingly, because the operation of purging the photosensitive liquid nozzle 4321 is performed at the same time when the substrate treating apparatus performs a process, productivity may be improved.

Further, the operation of purging two or more photosensitive liquid nozzles 4321 may be performed at the same time. In detail, the substrate treating apparatus performs purge operations on a first purge nozzle and a second purge nozzle at the same time. In a process of moving the nozzle arm 4320 from one of the first substrate support member 4100a and the second substrate support member 4100b to the other of the first substrate support member 4100a and the second substrate support member 4100b, the controller 1000 may perform a control such that the first purge nozzle purges the photosensitive liquid in the purge port 4500. Thereafter, even before an operation of purging the first nozzle is completed, the controller 1000 initiates the operation of purging the second purge nozzle, and in a process of moving the nozzle arm 4320 from one of the first substrate support member 4100a and the second substrate support member 4100b to the other of the first substrate support member 4100a and the second substrate support member 4100b, the controller 1000 may perform a control such that the second purge nozzle purges the photosensitive liquid in the purge port 4500. Further, even after the operation of purging the second purge nozzle is initiated, the operation of purging the first purge nozzle may be performed again. When the purge operations are performed on the two purge nozzles, the controller 100 may allow an operation of purging the first purge nozzle or the second purge nozzle to be completed first regardless of the initiation sequence of the purge operation.

According to an embodiment of the inventive concept, a substrate treating apparatus that efficiently treats a substrate and a substrate treating method may be provided.

Further, according to an embodiment of the inventive concept, a substrate treating apparatus that may perform a purge operation while a substrate is treated and a substrate treating method may be provided.

The above description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A substrate treating apparatus comprising:
   a first substrate support member and a second substrate support member configured to support a substrate;
   a plurality of nozzles configured to discharge a treatment liquid to the substrate located in the first substrate support member and the second substrate support member, the nozzles being connected to a treatment liquid source;
   a nozzle arm configured to support the nozzles;
   a purge port disposed between the first substrate support member and the second substrate support member, purge port including a cleaner configured to clean a purge nozzle, the cleaner being disposed in a bottom side of the purge port;
   a driving member configured to move the nozzle arm between any two of the first substrate support member, the purge port, and the second substrate support member, the driving member being disposed under the first substrate support member and the second support member; and
   a controller configured for controlling the nozzle arm and the driving member, the controller being electrically connected to the driving member, the nozzle arm, and the nozzles,
   wherein the controller controls the nozzle arm and the driving member such that the purge nozzle that is one of the plurality of nozzles performs a purge operation by discharging the treatment liquid to the purge port in a process of moving the nozzle arm to one of the first substrate support member and the second substrate support member after the nozzle arm discharges the treatment liquid from the other of the first substrate support member and the second substrate support member;

wherein the controller controls the cleaner such that the cleaner cleans the purge nozzle after the purge operations are performed a preset number of times.

2. The substrate treating apparatus of claim 1, wherein the controller is configured for allowing the purge nozzle to perform a purge operation a preset number of times in the process of moving the nozzle arm between the first substrate support member and the second substrate support member.

3. The substrate treating apparatus of claim 2, wherein the controller is configured to control the nozzle arm to continuously move between the first substrate support member and the second substrate support member in the purge operations of the preset number of times.

4. The substrate treating apparatus of claim 2, wherein the controller is configured to control the nozzle arm to intermittently move between the first substrate support member and the second substrate support member in the purge operations of the preset number of times.

5. The substrate treating apparatus of claim 1, wherein the controller is configured for generating an alarm if it is determined that the purge nozzle is to be used in the first substrate support member or the second substrate support member after the purge operation of the purge nozzle is started.

6. The substrate treating apparatus of claim 1, further comprising:

a holder in which a cassette in which the substrate is received is located, wherein the controller stops carrying-out of the substrate from the cassette if it is determined that the purge nozzle is to be used in the first substrate support member or the second substrate support member after the purge operation of the purge nozzle is started.

7. The substrate treating apparatus of claim 1, wherein the controller is configured for stopping carrying-in of the substrate to one of the first substrate support member and the second substrate support member, in which the purge nozzle is scheduled to be used, if it is determined that the purge nozzle is to be used in the first substrate support member or the second substrate support member after the purge operation of the purge nozzle is started.

8. The substrate treating apparatus of claim 1, wherein the treatment liquid comprises photosensitive liquid.

* * * * *